(12) United States Patent
Kawazoe

(10) Patent No.: US 6,731,048 B2
(45) Date of Patent: May 4, 2004

(54) PIEZOELECTRIC ACTUATOR WITH INSULATING MEMBER SEPARATE FROM PIEZOELECTRIC DEVICE

(75) Inventor: Naoyuki Kawazoe, Hashima (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/021,025

(22) Filed: Dec. 19, 2001

(65) Prior Publication Data

US 2002/0084723 A1 Jul. 4, 2002

(30) Foreign Application Priority Data

Dec. 28, 2000 (JP) .................................... 2000-400207

(51) Int. Cl.⁷ .............................................. H01L 41/09
(52) U.S. Cl. ....................................................... 310/328
(58) Field of Search ................................ 310/328, 340, 310/345, 366; H01L 41/09

(56) References Cited

U.S. PATENT DOCUMENTS

| | | | | | |
|---|---|---|---|---|---|
| 4,011,474 A | * | 3/1977 | O'Neill | ....................... | 310/328 |
| 4,051,396 A | * | 9/1977 | Berlincourt | .................. | 310/328 |
| 5,148,070 A | * | 9/1992 | Frye et al. | ................... | 310/168 |
| 5,148,077 A | * | 9/1992 | Grawey et al. | ............. | 310/328 |
| 5,295,288 A | * | 3/1994 | Dam et al. | ................... | 310/328 |
| 5,593,721 A | * | 1/1997 | Daidai et al. | .............. | 29/25.35 |
| 6,512,323 B2 | * | 1/2003 | Forck et al. | ................. | 310/332 |

FOREIGN PATENT DOCUMENTS

| | | | | |
|---|---|---|---|---|
| JP | A-61-284350 | | 12/1986 | |
| JP | 2-250678 | * | 2/1990 | .......... H02N/41/09 |
| JP | A-2-250678 | | 10/1990 | |
| JP | A-7-335952 | | 12/1995 | |

* cited by examiner

Primary Examiner—Karl Tamai
Assistant Examiner—Karen Addison
(74) Attorney, Agent, or Firm—Nixon & Vanderhye, PC.

(57) ABSTRACT

In a piezoelectric actuator 1 using a laminated piezoelectric device 10 having a plurality of layered piezoelectric layers, a metal case 2 is provided on the outside of the side surface of the piezoelectric device 10. An insulating member 4 made of a piece separate from the piezoelectric device 10 is provided between the piezoelectric device 10 and the case 2.

6 Claims, 8 Drawing Sheets

Fig. 4
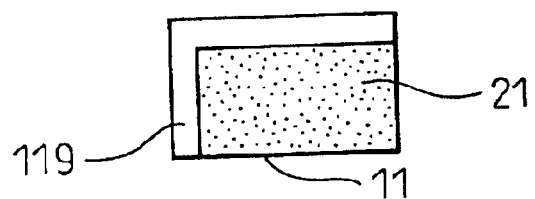
(a)
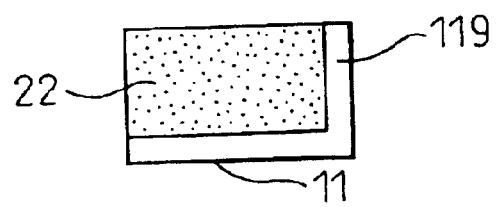
(b)
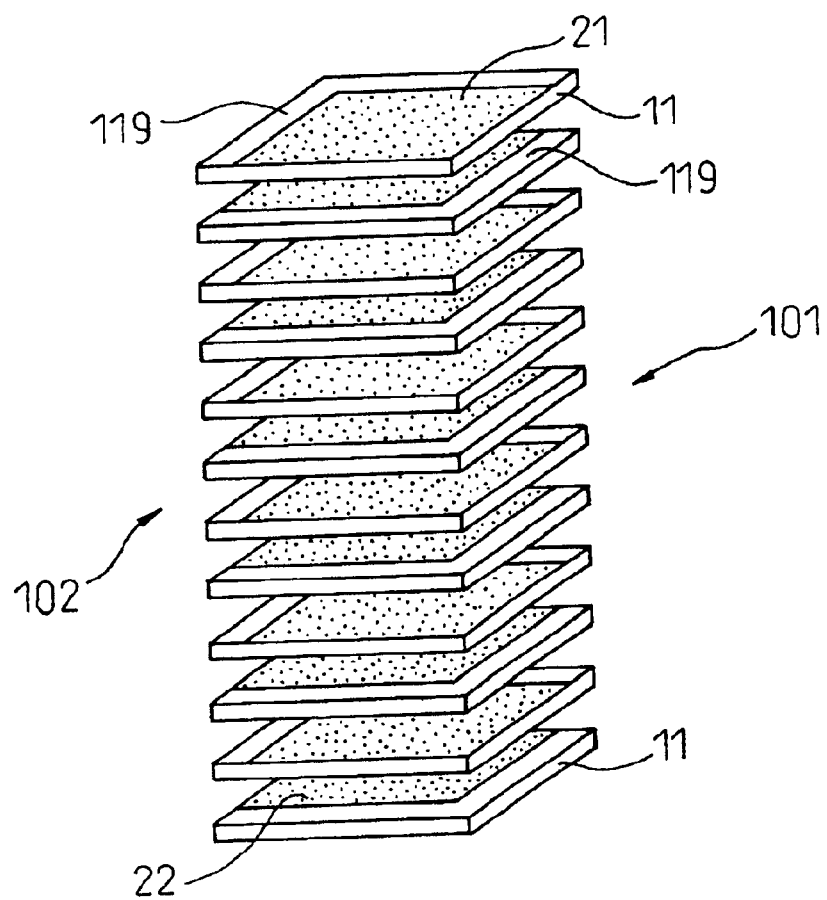
(c)

PIEZOELECTRIC ACTUATOR WITH INSULATING MEMBER SEPARATE FROM PIEZOELECTRIC DEVICE

BACKGROUND OF THE INVENTION

1. Field of the Invention

The present invention relates to a piezoelectric actuator using a piezoelectric device.

2. Description of the Related Art

Various structures of piezoelectric actuators have been conventionally proposed. For example, a piezoelectric actuator disclosed in Kokai (Japanese Unexamined Patent Publication) No. 7-335952 is provided with a piezoelectric device whose periphery is coated with an outer dense film (resin mold) of a uniform thickness.

Also, a piezoelectric actuator disclosed in Kokoku (Japanese Examined Patent Publication) No. 6-28832 has a sealed structure in which an extensible case is arranged on a side surface of a piezoelectric device.

Further, Kokai No. 2-250678 discloses a piezoelectric actuator in which a space between a piezoelectric device and a case is hermetically filled with silicon oil.

It is still difficult to apply conventional piezoelectric actuators to a device whose application requirements are strict, such as an injector (fuel injection system), for, for example, an internal-combustion engine for a motor vehicle. Namely, for example, in an injector, its actuator must be small and of quick-response.

To establish electrical insulation between the piezoelectric device and the case, a certain insulating distance must be provided therebetween. From the viewpoint of (reduction in diameter) miniaturization, insertion of resin, etc. therebetween, contributes to miniaturization much more than simple provision of the insulating distance.

However, if electric insulation is established by the resin mold as mentioned above, latter prevents extension and contraction of the piezoelectric device, thus resulting in reduction of the force to be produced by the piezoelectric device. Also, the resin mold can be cracked by the repeated extending-and-contracting operations so that the electrical insulation can be deteriorated. Especially in the injector, which requires quick-responsibility, the crack production probability is increased.

SUMMARY OF THE INVENTION

The invention is aimed at provision of a piezoelectric actuator which can be easily miniaturized and which exhibits high electric insulation, in view of drawbacks in the prior art.

According to an aspect of the present invention, in a piezoelectric actuator using a laminated piezoelectric device having alternately layered piezoelectric layers and electrode layers, provision is made of a metal case provided on the outside of the side surface of the piezoelectric device and an insulating member separate from the piezoelectric device, provided between the piezoelectric device and the case.

The mode of operation and the effect of the present invention will be explained below.

In the present invention, the insulating member is provided between the piezoelectric device and the case. The insulating member is made of a piece separate from the piezoelectric device. Therefore, when the extension and the contraction of the piezoelectric device occurs, the movements are little restricted by the insulating member. Consequently, the force produced by the piezoelectric device is little reduced by the insulating member.

Further, unlike the resin mold, no crack of the insulating member occurs due to the extending-and-contracting movements of the insulating member caused by the extending-and-contracting movements of the piezoelectric device. As a result, high electric insulatability of the insulating member can be maintained. With the presence of the insulating member, the distance between the metal case and the piezoelectric device can be decreased, as compared to the absence of insulating member. Thus, the piezoelectric actuator can be miniaturized.

Therefore, according to the present invention, a piezoelectric actuator having a high electric insulatability, which can be easily miniaturized is obtained.

According to another aspect of the present invention, it is preferable that the insulating member be a cylindrical sleeve made of resin or paper. In this aspect, since the insulating member is in the form of a sleeve, the insulating member can be arranged merely by inserting the piezoelectric device in the sleeve, so that the piezoelectric actuator can be easily assembled.

According to still another aspect of the present invention, the insulating member can be in the form of a resin or paper sheet wound around the piezoelectric device. In this aspect, the insulating member is wound when assembling, so that an optimum shape of insulating member corresponding to the cross-sectional shape, size, etc., of the piezoelectric device, can be easily formed.

According to yet another aspect of the present invention, it is preferable that at least the overlapped portions of the wound sheet material be adhered to each other. Namely, the sheet member is preferably coated with an adhesive layer or is preferably made of self-adhesive resin so that the overlapped portions are adhered to each other. In this alternative, no displacement of the overlapped portions of the insulating member takes place in the case, thus resulting in a stable arrangement.

Note that if the adhesive-coated sheet is wound around the piezoelectric device, the sheet may be adhered to the piezoelectric device. In this case, the adhesion can be accepted so long as the piezoelectric device can be extended and contracted. Rather, the adhesion contributes to a stable arrangement of the insulating member.

According to another aspect of the present invention, it is preferable that the maximum thickness of the insulating member be no more than 0.3 mm. In this aspect, the heat radiation efficiency of the insulating member can be enhanced.

The present invention may be more fully understood from the description of the preferred embodiments of the invention set forth below, together with the accompanying drawings.

BRIEF DESCRIPTION OF THE DRAWINGS

In the drawings:

FIG. 4 are plan views (a, b) of a piezoelectric layer and an internal electrode layer, and is an exploded perspective view (c) showing the lamination of piezoelectric layers and internal layers, in Embodiment 1.

DESCRIPTION OF THE PREFERRED EMBODIMENTS

Embodiment 1

The piezoelectric actuator according to an embodiment of the present invention will be explained with reference to FIGS. 1 through 4.

Figure 1:
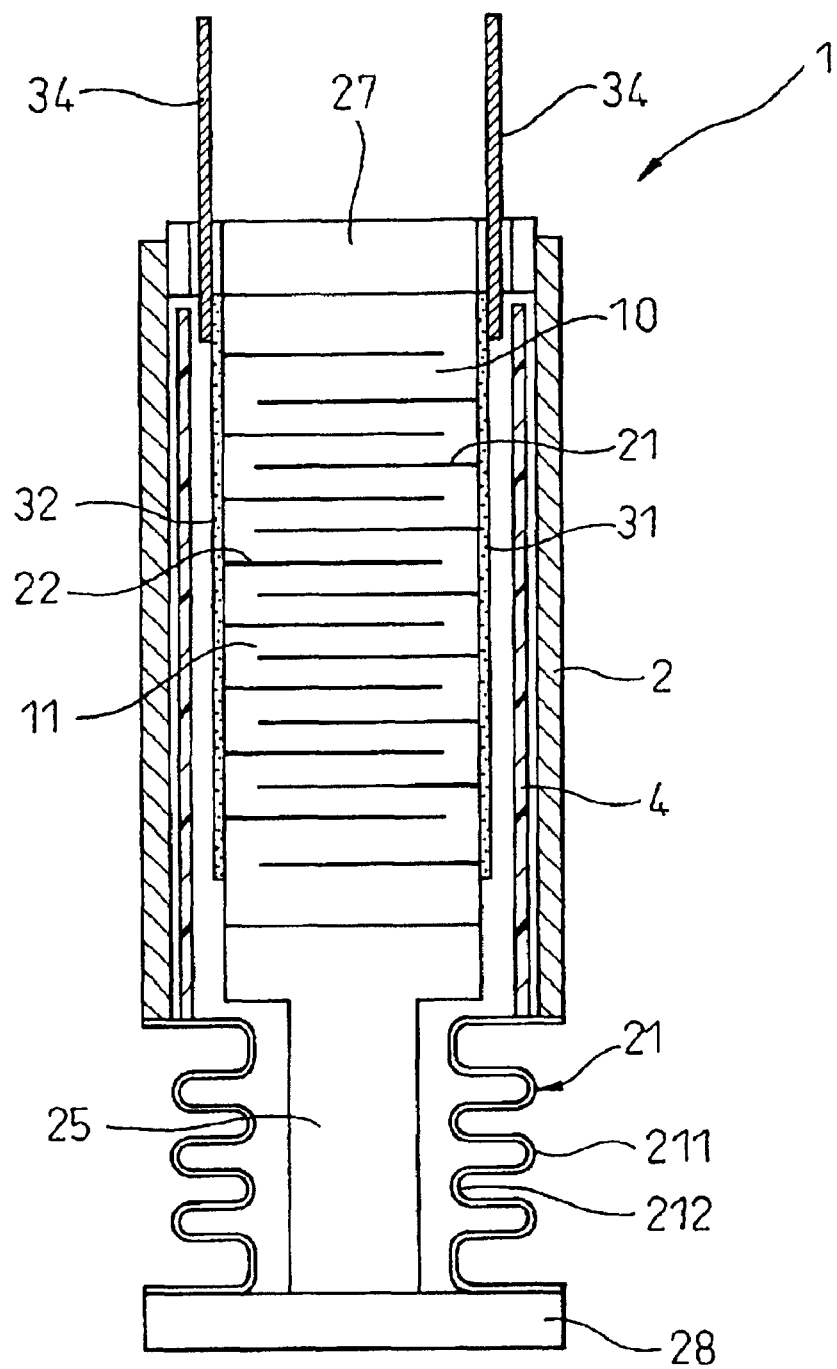
FIG. 1 is an explanatory view showing a structure of a piezoelectric actuator according to Embodiment 1.
Figure 3:
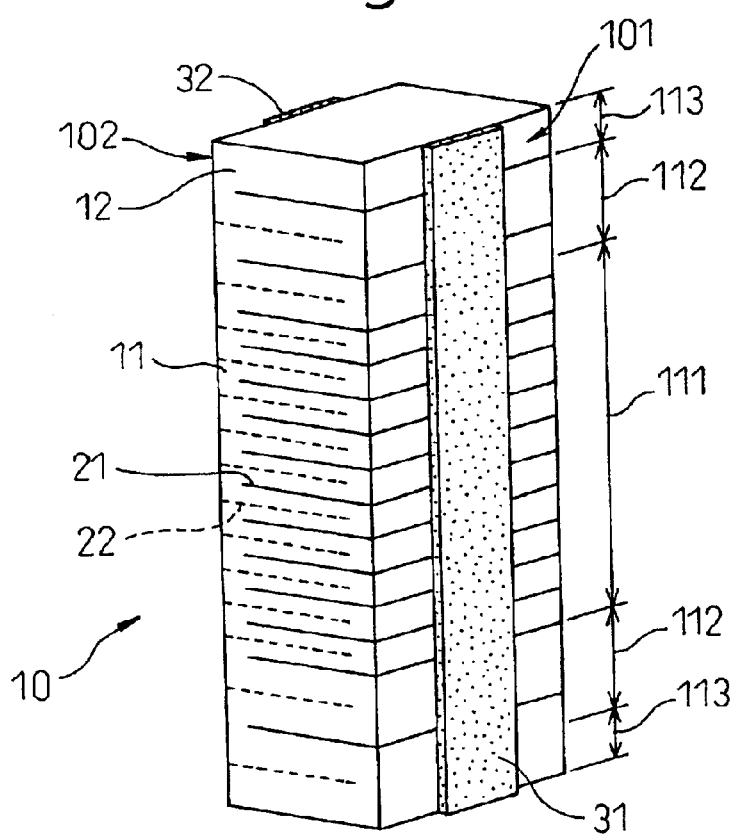
FIG. 3 is a perspective view of a piezoelectric device according to Embodiment 1.

As shown in FIGS. 1 and 3, a piezoelectric actuator 1 in this embodiment is comprised of a laminated piezoelectric device 10 having a plurality of laminated piezoelectric layers.

A metal case 2 is provided outside the side surface of the piezoelectric device 10. An insulating member 4, made of a piece separate from the piezoelectric device 10, is arranged between the piezoelectric device 10 and the case 2.

The embodiment will be explained below in more detail.

As shown in FIGS. 3 and 4, the piezoelectric device 10 has internal electrode layers 21, 22, which are arranged between the piezoelectric layers 11 so as to form positive and negative electrodes alternately. As shown in the drawings, the internal electrode layers 21 are exposed to one side surface 101 and the other internal electrode layers 22 are exposed to the other side surface 102. Side electrodes 31, 32 made of baked silver are provided on the side surfaces 101 and 102 of the piezoelectric device 10 to electrically connect the exposed ends of the internal electrode layers 21 and 22, respectively. The baked silver of which the side electrodes 31 and 32, which are formed by curing Ag paste are made, is composed of Ag (97%) and a glass frit constituent (3%).

External electrodes 34 (shown in FIG. 1) are joined to the side electrodes 31 and 32 by conductive adhesive which is composed of Ag 80% and epoxy resin 20%.

In the piezoelectric device 10, as shown in FIG. 3, the middle portion thereof in the laminating direction is referred to as a driving portion 111; the portions, sandwiching the driving portions therebetween, are referred to as buffer portions 112; and the portions, sandwiching the buffer portions 112 therebetween, are referred to as dummy portions 113, respectively.

A method for manufacturing the piezoelectric device 10 and the detailed structure thereof will be explained.

The piezoelectric device 10 of the embodiment can be manufactured by a green sheet method which has been widely used. By a known method, powder of main ingredients of piezoelectric materials, such as leadmonoxide, zirconium oxide, titanium oxide, niobium oxide, strontium carbonate, etc., are measured to obtain desired composition of a green sheet. In practice, the ingredients are blended at a ratio richer by 1–2% than the stoichiometric ratio, taking into account the evaporation of lead. The components are dry-mixed by a mixer and are temporary-burned at 800–950° C.

Thereafter, the temporary-burned powder is turned into slurry by adding pure water and a dispersant thereto. The slurry is wet-pulverized by a purl mill, dried, degreased and mixed with a solvent, binder, plasticizer, dispersant, etc. by a ball mill. Thereafter, the slurry is stirred by a stirrer within a vacuum device so that it can be vacuum-defoamed and that the viscosity can be adjusted.

The slurry is formed into a green sheet of a uniform thickness by a doctor blade device. The recovered green sheet is punched by a press machine or cut off by a cutter into a predetermined size of rectangular body. The green sheet can be commonly used for the drive portion, the buffer portions and the dummy portions.

One side surface of the formed green sheet is screen-printed with a pattern using a paste (referred to as "Ag/Pd paste", hereinafter) composed of, for example, silver: palladium=7:3. FIG. 4(a) and (b) show an example of the green sheet printed with the pattern. For convenience of explanation, same numerals are assigned to the parts substantially identical.

By the Ag/Pd paste, the substantially overall surface of the green sheet 11 which defines a piezoelectric layer is printed with patterns 21 (22) slightly smaller than the surface, to form the internal electrode layers 21 (22). Non-printed portions 119 on which the internal electrode layers 21 (22) are not formed are provided on the two opposed sides of the surface of the green sheet 11. Namely, the internal electrode layers 21 (22) are arranged so that they do not reach one of the two opposed sides of the green sheet 11 but reach the opposed other end thereof.

A predetermined number of the green sheets 11, each having the internal electrode layers 21 (22) thereon, are prepared in accordance with the specifications concerning the amount of displacement of the drive portion 111 and the buffer portions 112. A required number of green sheets 12 having no internal electrode layer printed thereon, for the buffer portions 112 and the dummy portions 113, are also prepared.

Next, the green sheets 11 are superimposed. FIG. 4(c) shows the lamination of the green sheets 11 and is substantially an exploded view of the piezoelectric device 10. Note that the drive portion and portions relating thereto are mainly shown in FIG. 4(c).

The green sheets 11 having the internal electrode layers 21 (22) thereon are overlaid so that the non-printed parts 119 of the electrodes are arranged alternately in the right and left directions in the figure. Thereby, the internal electrode layers 21, reaching and exposed to the right side surfaces 101 in the figure, of the green sheets 11, form an internal electrode of one polarity, and the internal electrode layers 22, reaching and exposed to the left side surfaces 102 in the figure, form an internal electrode of the opposite polarity.

In the middle drive portion 111 shown in FIG. 4(c), only the green sheets 11 having the internal electrode layers 21 (22) thereon are laminated. In the buffer portions 112, the green sheets 11 are laminated with the green sheets 12 having no internal electrode layer being inserted therebetween. In the dummy portions 113, only the green sheets 12 having no internal electrode layers thereon are laminated. Thus, a multilayered structure as shown in FIG. 3 is obtained.

The laminated green sheets, after having been subject to thermocompression-bonding by a hot water rubber pressing, etc., are degreased at 400–700° C. and are fired at 900–1,200° C. in an electric furnace.

Thereafter, the side of the laminated structure is coated and cured with the Ag paste in order to form the side electrodes 31, 32. The side electrodes can be formed by curing, for example, Ag/Pd paste, though they are made of the cured silver in the embodiment.

Copper, nickel, platinum, silver/palladium, etc., can be used for the material of the internal electrode layers, other than those shown in the embodiment.

The right side electrode 31, shown in FIG. 3, is provided on the exposed internal electrode layer 21 portions of one polarity, so that the internal electrode layers 21 can be electrically connected. The other left side electrode 32, shown in FIG. 3, is provided on the exposed internal electrode layer 22 portions of the opposite polarity, so as to electrically connect the internal electrode layers 22.

Thereafter, the external electrodes 34 (FIG. 1) are joined to the side electrodes 31 and 32 by the conductive adhesive paste which is applied thereto and baked.

Thereafter, the laminated structure provided with the external electrodes 34 is dipped in fluorinert (manufactured by 3M), and the piezoelectric layers 11 is polarized by applying a direct-current voltage between the internal electrode layers 21 and 22 through the external electrodes 34 to obtain the piezoelectric device 10.

In this embodiment, corrugated foils of SUS304 having thickness 0.05 mm are adhered to the side electrodes to form the external electrodes. It is also possible to adhere the external electrodes by soldering, brazing, etc., in place of the joining method used in this embodiment. Alternatively, it is possible to connect the external electrodes to the internal electrodes by means of an electrically conductive adhesive, without forming the side electrodes. Further, a metallic foil or wire (including a coated wire), etc., which is electrically conductive, may be also used for the material of the external electrodes, other than the material in this embodiment.

The external electrodes 34 may be joined to the substantially overall length of the side electrodes though they are joined to parts of the side electrodes in this embodiment.

Each of the external electrodes 34 may be formed by connecting two pieces, i.e., a piece electrically connected to the outside of the case, and a piece electrically connected to the side electrodes of the piezoelectric device, by welding, soldering, brazing or caulking, etc.

Thereafter, the piezoelectric device 10 is housed in the case 2 made of stainless steel, together with the insulating member 4 in the form of a sleeve. A cylindrical resin sleeve of 0.3 mm thickness, made of nylon 66, is used for the insulating member 4 in the embodiment. For the resin sleeve, the nylon 66 can be replaced with various resin materials having electric insulatability. Especially, heat-resistant materials, such as polyphenylene sulfide, fluorocarbon resin, polyimide, polyimide/amide, silicone resin, etc. can be effectively used for the injectors, etc. which are subject to high temperature.

In this embodiment, the inside diameter of the resin sleeve is larger than a circumcircle to a cross section of the piezoelectric device, in a direction perpendicular to the extending and contracting direction of the piezoelectric device. Alternatively, the inside diameter of the resin sleeve may be slightly smaller than a circumcircle to the cross section of the piezoelectric device, in a direction perpendicular to the extending and contracting direction of the piezoelectric device. In this alternative, the sleeve is provided with a slit so that when it is assembled, the sleeve is expanded in its diameter. Consequently, the sleeve can be held on the piezoelectric device due to its elasticity.

The case is 2 is provided on its one end with an extensible part 21 for absorbing the extending-and-contracting movement of the piezoelectric device 10. In this embodiment, a bellows in which large diameter parts 211 and small diameter parts 212 are arranged alternately is used for the extensible part 21. In place thereof, other structures, for example, a double-pipe structure in which two pipes sealed by an 0 ring are slidable, can be applied.

Also, in this embodiment, the piezoelectric device 10 is provided on its one end with a piston member 25 whose front end is joined to a lower plate 28. The front end of the extensible part 21 and the lower plate 28 are welded at their outer peripheries so that the front end is sealed.

Further, the piezoelectric device 10 is provided, on the other end (upper side in FIG. 1), with an upper plate 27 which is welded to the top end of the case 2 at their outer peripheries to obtain a sealed structure. Prior to the peripheral welding, the air in the case 2 is replaced with dry air in order to prevent deterioration such as internal corrosion, etc.

In this embodiment, it should be significantly appreciated that the resin sleeve made of a piece separate from the piezoelectric device 10 is used for the insulating member 4. Namely, in this embodiment, the insulating member 4 in the form of a sleeve, which is not adhered to the piezoelectric device 10, is provided between the piezoelectric 10 and the case 2. Therefore, when the extension and the contraction of the piezoelectric device 10 occurs, the movements are little restricted by the insulating member 4. Consequently, the force produced by the piezoelectric device 10 is little reduced by the insulating member 4.

Further, unlike the resin mold, no crack of the insulating member occurs due to the extending-and-contracting movements of the piezoelectric device. As a result, high electric insulatability of the insulating member 4 can be maintained. With the presence of the insulating member 4, the distance between the metal case 2 and the piezoelectric device 10 can be decreased, as compared to the absence of insulating member. Thus, the piezoelectric actuator 1 can be miniaturized.

Embodiment 2

Figure 5:
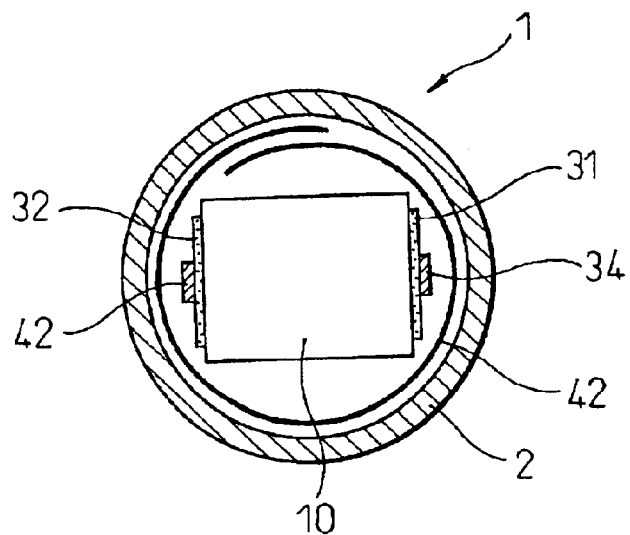
FIG. 5 is a cross-sectional view of a piezoelectric actuator according to Embodiment 2.

According to an embodiment shown in FIG. 5, an insulating member 42 made of a wound insulating paper is used in place of the insulating member of the resin sleeve in Embodiment 1. That is, in this embodiment, for the insulating member 42, a Nomex aramid paper (manufactured by Du Pont) of 0.18 mm thickness is prepared and is wound by one turn or more to wrap the outer periphery of the side surface of the piezoelectric device 10. For the insulating member 42 in the wound state, the insulating paper can be replaced with a sheet material such as a resin film, etc. Also, an adhesive tape and a self-fusion-bonding tape, having an adhesive layer can be used for the sheet material. For the self-fusion-boding tape, for example, a self-fusion-bonding silicone-rubber tape, No. 66, manufactured by Nittoshinko Corp., etc., can be used. Other structure in this embodiment is the same as Embodiment 1.

In this embodiment, since the insulating member 42 can be provided by winding the same around the piezoelectric device 10, the assembling can be extremely facilitated. Apart from the easy assembling, the same mode of operation and effect as those in Embodiment 1 can be obtained.

Embodiment 3

Figure 6:
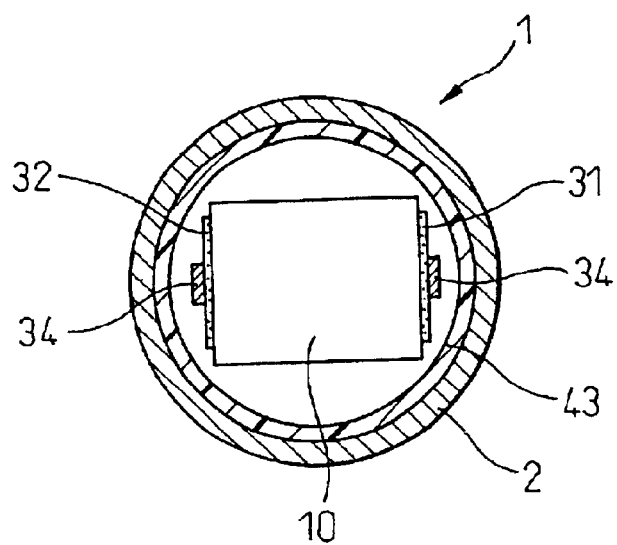
FIG. 6 is a cross-sectional view of a piezoelectric actuator according to Embodiment 3.

According to an embodiment shown in FIG. 6, an insulating member 43 adhered to the inner wall of the case 2, is used in place of the insulating member of the resin sleeve in Embodiment 1. Namely, in this embodiment, the inner wall of the case 2 is coated with a thermosetting polyimide resin, hardened and baked at 250° C. Also, the polyimide resin can be replaced with resin materials such as an epoxy resin, silicone resin, etc., or inorganic materials such as glass, etc. Other structure of this embodiment is the same as Embodiment 1.

In this embodiment, since the insulating member 43 is made integral with the case 2, the insulating member 43 can be stably secured. Aside from the stable securing, the same mode of operation and effect as those in Embodiment 1 can be obtained.

Embodiment 4

Figure 7:
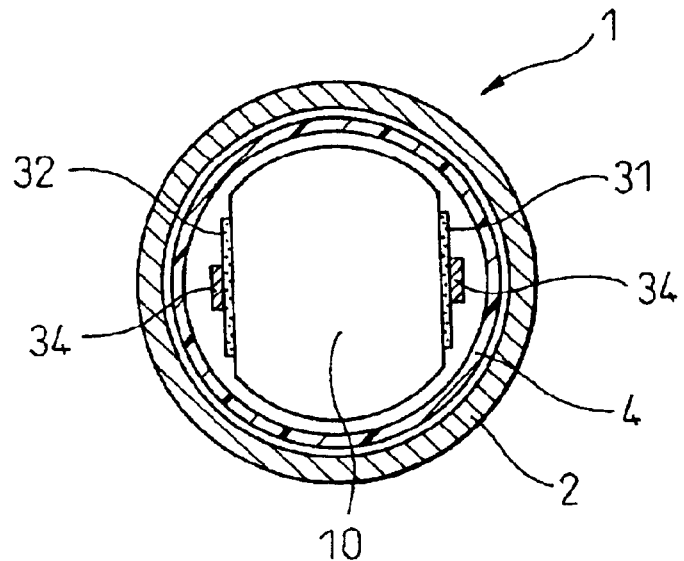
FIG. 7 is a cross-sectional view of a piezoelectric actuator according to Embodiment 4.
Figure 8:
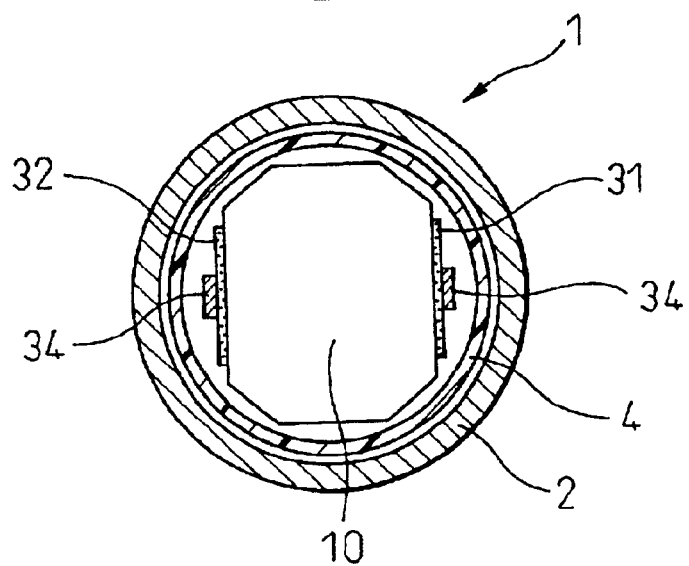
FIG. 8 is a cross-sectional view of another piezoelectric actuator according to Embodiment 4.
Figure 11:
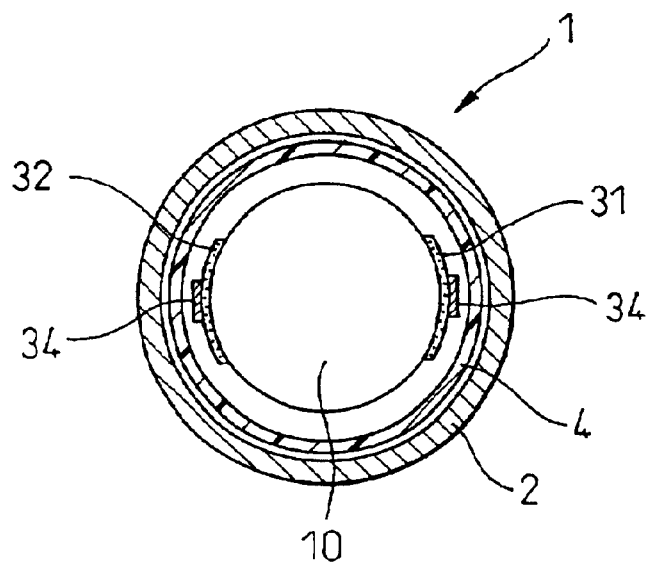
FIG. 11 is a cross-sectional view of still another piezoelectric actuator according to Embodiment 4.
Figure 12:
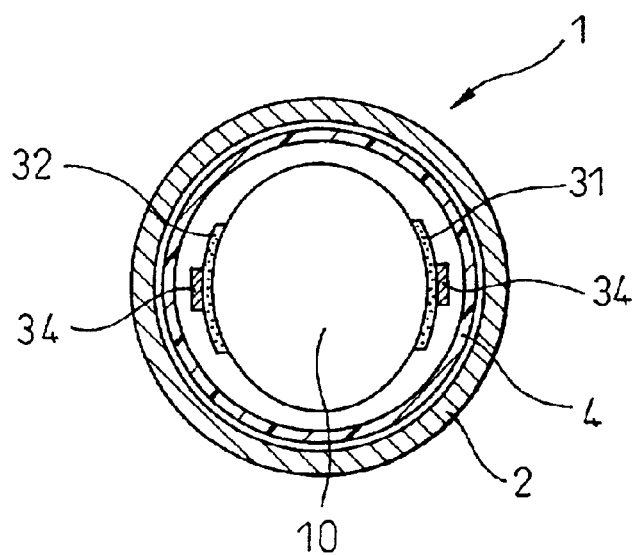
FIG. 12 is a cross-sectional view of yet another piezoelectric actuator according to Embodiment 4.

In an embodiment, shown in FIGS. 7 and 8, the cross-sectional shape of the piezoelectric device 10 in Embodiment 1 is modified. That is, in the piezoelectric actuator 1 shown in FIG. 7, the piezoelectric device 10 has a cross-sectional shape in the form of a barrel. In the piezoelectric actuator 1 shown in FIG. 8, the piezoelectric device 10 has an octagonal (polygonal) cross-sectional shape. Moreover, in the piezoelectric actuator 1, the piezoelectric device 10 may have a circular cross-sectional shape, as shown in FIG. 11, or may have an elliptic cross-sectional shape, as shown in FIG. 12.

In these piezoelectric actuators 1, as compared to that shown in Embodiment 1, the cross-sectional shape of the piezoelectric device 10 is closer to a circle, so that the piezoelectric device 10 can occupy a large part of the inner space of the circular case 2. Therefore, a small-sized, high-powered piezoelectric actuator 1 in which the space is effectively utilized can be obtained. Apart from the foregoing, the same mode of operation and effect as those in Embodiment 1 can be obtained.

Embodiment 5

According to this embodiment, the piezoelectric actuator 1 in Embodiment 1 is incorporated in the injector 5.

Figure 9:
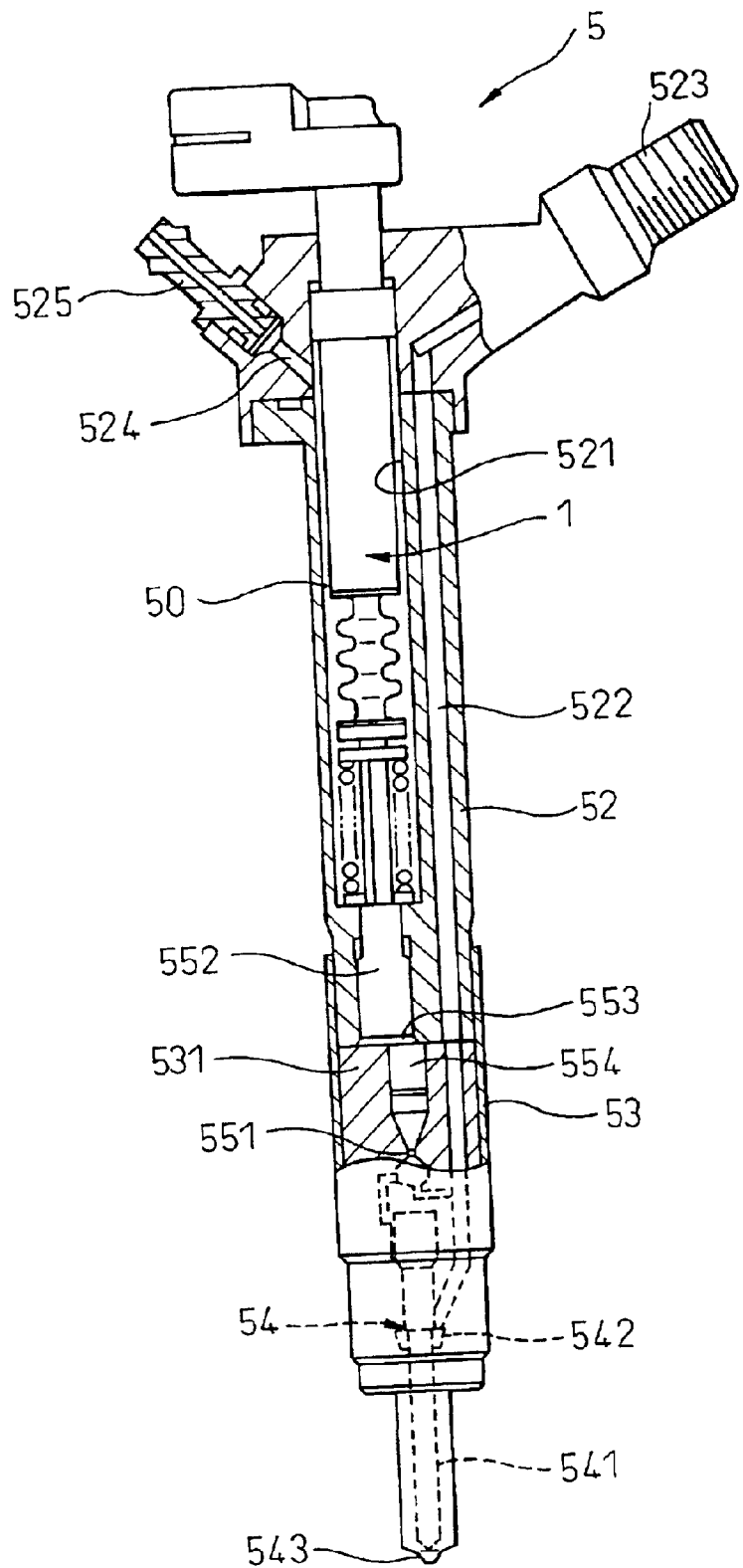
FIG. 9 is an explanatory view showing a structure of an injector according to Embodiment 5.

In this embodiment, as shown in FIG. 9, the injector 5 is applied to a common rail injection system for a diesel engine. As shown in the figure, the injector 5 is comprised of an upper housing 52 which houses therein the piezoelectric actuator 1 as the driving portion, and a lower housing 53 which has therein an injection nozzle part 54 and which is secured to the lower end of the upper housing 52.

The upper housing 52 is substantially cylindrical and has an longitudinal hole 521 eccentric from the central axis, in which the piezoelectric actuator 1 is inserted in and secured.

A high-pressure fuel passage 522 is provided aside and in parallel with the longitudinal hole 521. The top end of the passage 522 is connected to an external common rail (not shown in the figure) through a fuel introduction pipe 523 which extends upward from the upper portion of the upper housing 52.

A fuel discharging pipe 525 projects from the upper part of the upper housing 52, and is connected to a drain passage 524. Fuel discharged from the fuel discharging pipe 525 is returned to a fuel tank (not shown).

The drain passage 524 is connected to a gap 50 defined between the longitudinal hole 521 and the driving portion (piezoelectric device) 1 and is further connected to a 3 way valve 551, which will be discussed hereinafter, by a passage (not shown) extending downward, from the gap 50, in the upper and lower housings 52 and 53.

The injection nozzle part 54 is comprised of a nozzle needle 541 which is slidable vertically in a piston body 531, and an injection hole 543 which is opened and closed by the nozzle needle 541, to inject the high-pressure fuel, supplied from a fuel well 542 to each engine cylinder. The fuel well 542 is provided around the middle part of the nozzle needle 54. The bottom end of the high-pressure fuel passage 522 opens into the fuel well 542. The nozzle needle 541 receives a fuel pressure in a valve-opening direction from the fuel well 542, and a fuel pressure in a valve-closing direction from a back pressure chamber 544 provided to face the top end surface thereof. When the pressure of the back pressure chamber 544 decreases, the nozzle needle 541 is lifted and the injection hole 543 is opened so that the fuel injection occurs.

The pressure in the back pressure chamber 544 is increased or decreased by the 3 way valve 551. The 3 way valve 551 selectively connects the back pressure chamber 544 to the high-pressure fuel passage 522, or to the drain passage 524. In this embodiment, the 3 way valve 551 has a ball-type valve body for opening and closing a port connected to the high-pressure fuel passage 522 or to the drain passage 524. The valve body is driven by the driving portion 1, through a large diameter piston 552, a hydraulic pressure chamber 553 and a small diameter piston 554, which are arranged below the driving portion 1.

The piezoelectric actuator 1 is inserted in the longitudinal hole 521 of the injector 5, with providing the gap 50 through which the fuel passes. The piezoelectric actuator 1 is arranged so that the case body 41 is secured and the front end of the extensible part 42 is moved reciprocally.

In the injector 5, the inner diameter of the longitudinal hole 521 is restricted to reduce the size thereof, and the piezoelectric actuator 1 is shaped accordingly.

Figure 2:
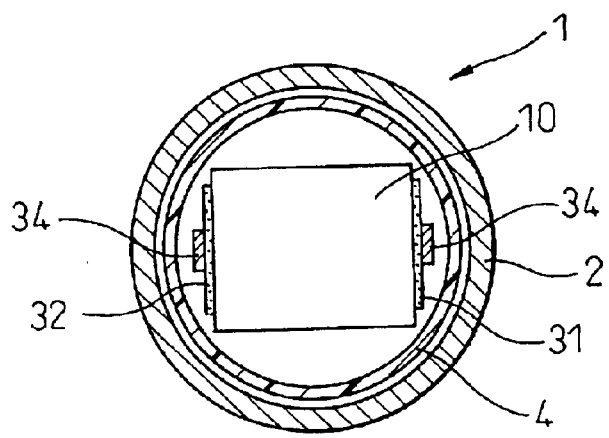
FIG. 2 is a cross-sectional view of a piezoelectric actuator according to Embodiment 1 (cross-sectional view along the line A—A of FIG. 1).

According to this embodiment, and as shown in FIGS. 1 and 2, in the piezoelectric actuator 1, the insulating member 4 made of a separate piece therefrom is provided between the piezoelectric device 10 and the case 2. Therefore, when the extension and the contraction of the piezoelectric device 10 occurs, the movements are little restricted by the insulating member 4. Consequently, the force generated by the piezoelectric device 10 is little reduced by the insulating member 4.

Further, as described above, no crack of the insulating member 4 occurs due to the extending-and-contracting movements of the piezoelectric device 10. As a result, high electric insulatability of the insulating member 4 can be maintained. Therefore, the piezoelectric actuator 1, according to this embodiment, can ensure quick-responsivity required for application of the piezoelectric actuator 1 to the injector 5, and can improve the performance and the durability of the injector 5.

Embodiment 6

Figure 10:
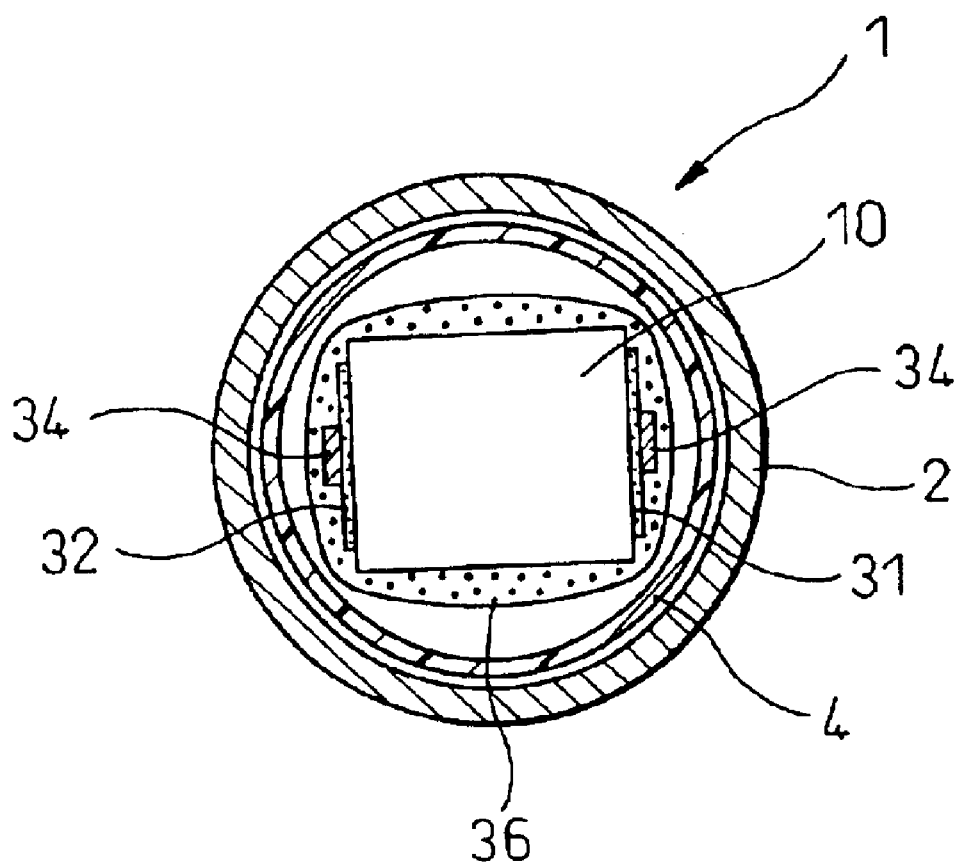
FIG. 10 is a cross-sectional view of a piezoelectric actuator according to Embodiment 6.

In an embodiment shown in FIG. 10, a piezoelectric device whose structure is partially different from that of the piezoelectric device in Embodiment 1 is used.

Namely, in Embodiment 1, no internal electrode layer of each polarity is exposed to any one of the side surfaces of the piezoelectric device 10, but, in this embodiment, positive and negative electrode are exposed.

If each piezoelectric layer is too thin to provide sufficient insulating distance between the positive and negative electrodes, the insulating member 4 the same as that in embodiment 1 may be arranged after an insulating coating layer 36 is provided to insulate the positive and negative electrodes, as shown in FIG. 10. For this insulating coating layer, a grease-type, gel-type insulating member in which no crack occurs and which does not prevent the extending-and-contracting movement of the piezoelectric device can be preferably used. Apart from the foregoing, the embodiment is the same as Embodiment 1.

While the invention has been described by reference to specific embodiments chosen for the purposes of illustration, it should be apparent that numerous modifications could be made thereto by those skilled in the art without departing from the basic concept and scope of the invention.

What is claimed is:

1. A piezoelectric actuator using a laminated piezoelectric device having alternately layered piezoelectric layers and electrode layers comprising:

a metal case provided on the outside of the side surface of the piezoelectric device; and an insulating member provided between the piezoelectric device and the case, said insulating member being made of a piece separate from the piezoelectric device, wherein said insulating member comprises a paper or resin sheet wound around the piezoelectric device.

2. A piezoelectric actuator as set forth in claim 1, wherein at least overlapped portions of the wound sheet are adhered to each other.

3. A piezoelectric actuator using a laminated piezoelectric device having alternately layered piezoelectric layers and electrode layers comprising:

a metal case provided on the outside of the side surface of the piezoelectric device; and an insulating member provided between the piezoelectric device and the case, said insulating member being made of a piece separate from the piezoelectric device;

wherein the piezoelectric device has a polygonal or barrel-shaped cross section perpendicular to its extending-and-contracting direction.

4. A piezoelectric actuator as set forth in claim 3, wherein the insulating member is adhered to the inner wall of the case.

5. A piezoelectric actuator as set forth in claim 3, wherein the maximum thickness of the insulating member is no more than 0.3 mm.

6. A piezoelectric actuator as set forth in claim 3, wherein the piezoelectric actuator is incorporated in an injector and drives the injector.

* * * * *